Figure 1:
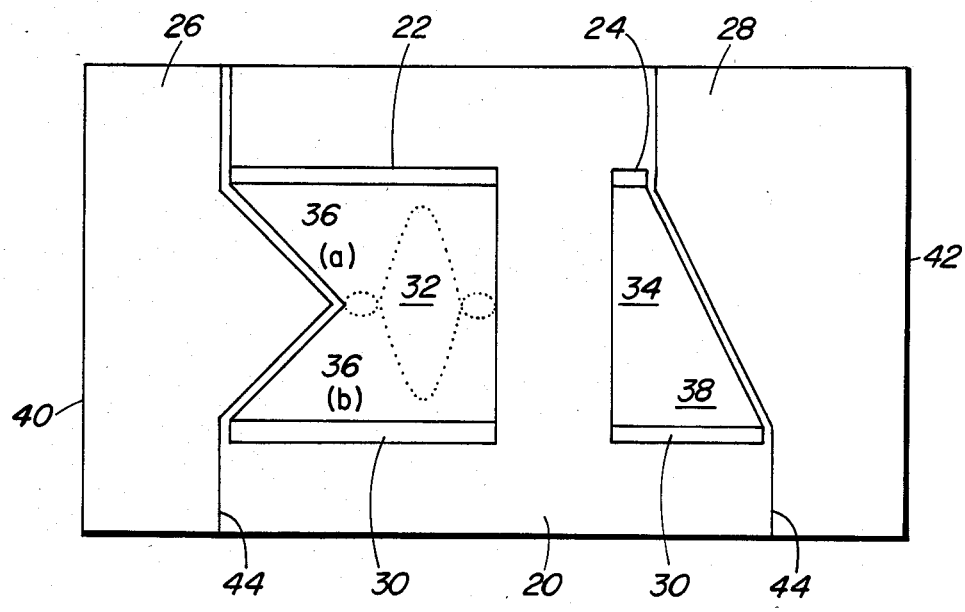

United States Patent [19]

Este et al.

[11] Patent Number: 4,684,841

[45] Date of Patent: Aug. 4, 1987

[54] SAW DEVICES INCLUDING RESISTIVE FILMS

[75] Inventors: Grantley O. Este, Stittsville; Mark S. Suthers, Lanark; Richard W. Streater; Blair K. MacLaurin, both of Nepean, all of Canada

[73] Assignee: Northern Telecom Limited, Montreal, Canada

[21] Appl. No.: 718,590

[22] Filed: Apr. 1, 1985

[51] Int. Cl.$^4$ ............................................. H01L 41/4
[52] U.S. Cl. .............................. 310/313 B; 310/313 C; 333/151; 333/195
[58] Field of Search ............... 367/164; 310/313 C, 310/313 B, 313 R, 313 D; 29/29, 35; 333/151, 195

[56] References Cited

U.S. PATENT DOCUMENTS 3,760,299  9/1973  Vasile ........................... 333/151
4,223,286  9/1980  Ono et al. ..................... 310/313 A
4,450,374  5/1984  Cho et al. ...................... 29/25.35
4,463,327  7/1984  Suzuki et al. .................. 310/313 C

FOREIGN PATENT DOCUMENTS 54-12661  1/1979  Japan .

Primary Examiner—Charles T. Jordan
Assistant Examiner—John W. Eldred
Attorney, Agent, or Firm—R. John Haley

[57] ABSTRACT

Each IDT (inter-digital transducer) of a SAW (surface acoustic wave) device is formed on a thin resistive doped silicon film having the same pattern as the IDT, which improves adhesion of the IDT to the substrate. The silicon film also constitutes electroacoustic absorbers between the IDTs and edges of the substrate, and can have a linearly tapered edge adjacent to each IDT to suppress reflections at the absorber boundary. The SAW device is formed by sputtering silicon onto the substrate, subsequently forming the IDTs, and then etching the silicon from areas where it is not wanted.

28 Claims, 3 Drawing Figures

SAW DEVICES INCLUDING RESISTIVE FILMS

This invention relates to SAW (surface acoustic wave) devices, and is particularly concerned with an improved method of producing SAW devices, preferably including surface acoustic wave absorbers, and with improved SAW devices which may be produced by this method.

Reference is directed to a copending patent application assigned to Northern Telecom Limited filed on the same date as this application and entitled "SAW devices with reflection-suppressing fingers", the entire disclosure of which is hereby incorporated herein by reference.

It is well known to apply acoustic absorber to the surface of the substrate of a SAW device between the back edges of the IDTs (inter-digital transducers) and the edges of the substrate in order to attenuate undesired surface acoustic waves which would otherwise be reflected at the substrate edges and interfere with the desired waves, seriously degrading the performance of the SAW device. The acoustic absorber is generally a viscous material, such as viscous epoxy, which is manually applied after formation of the IDTs on the substrate. This is an inconvenience during the manufacture of SAW devices, and the boundary of the acoustic absorber may itself give rise to an undesired reflected surface acoustic wave. Furthermore, the acoustic absorber is frequently an organic material which can produce problems due to outgassing over a period of time.

It is also known to cut the substrate edges at angles so that reflected waves are not directed back into the region of the IDTs. This again is an inconvenience during manufacture of SAW devices.

An object of this invention, therefore, is to provide an improved method of producing SAW devices, and to provide an improved SAW device.

According to one aspect of this invention there is provided a method of producing a SAW (surface acoustic wave) device comprising the steps of: forming a resistively conductive (hereinafter referred to as resistive) film on a surface of a substrate of piezo-electric material; and forming at least one IDT (inter-digital transducer) for the SAW device on the resistive film.

Thus the or each IDT is formed on a resistive film on the substrate surface; it has been found that the resistive film improves adhesion of the IDT to the substrate and facilitates production of the SAW device without detracting from the performance of the SAW device.

The resistive film can not be present in areas where it is desired to propagate surface acoustic waves because the film acts to attenuate such waves. Accordingly, the resistive film can be formed on the substrate surface in the pattern of each IDT to be formed thereon. In this case the resistive film can also be formed with at least one area defining a surface acoustic wave absorber region adjacent to this pattern, the resistive film constituting a surface acoustic wave absprber in this region. In each such area the resistive film is desirably formed with a substantially linear tapered edge adjacent to the IDT pattern, this edge serving to reduce surface acoustic wave reflections at the boundary of the surface acoustic wave absorber region.

Preferably, however, the resistive film is formed on substantially all of said surface, the method further including the step of removing part of the resistive film after forming the IDT. The resistive film in this case facilitates production of the SAW device by shorting out charges which can occur due to the piezo-electric nature of the substrate.

The step of removing part of the resistive film preferably comprises the step of leaving the resistive film in at least one area on the substrate surface to define a surface acoustic wave absorber region in this area, which is desirably adjacent to the IDT formed on the resistive film and desirably has a substantially linear tapered edge adjacent to the IDT for the same reason as explained above.

The resistive film is conveniently a doped silicon film having a thickness of about 100 Angstrom units, to provide a sheet resistivity of at least about 0.5 Mohm/sq., which film may be formed by sputtering silicon onto the surface of the substrate, which is conveniently of lithium niobate. The step of removing part of the silicon film after forming the IDT preferably comprises etching the silicon film for example using a carbon tetrafluoride and oxygen plasma etch. The step of forming the IDT preferably comprises evaporating aluminum onto the silicon film in the pattern of the IDT; the aluminum IDT pattern protects the underlying silicon film from the plasma etch.

According to another aspect this invention provides a SAW (surface acoustic wave) device comprising at least one IDT (inter-digital transducer) on a resistive film, having substantially the same pattern as the IDT, on a surface of a substrate of piezo-electric material.

The SAW device preferably includes a resistive film on the substrate surface constituting a surface acoustic wave absorber in a region adjacent to the IDT.

Advantageously the resistive film constituting the surface acoustic wave absorber and the resistive film having the IDT thereon are films of substantially the same material and thickness, both films for example comprising amorphous doped silicon with a sheet resistivity of at least about 0.5 Mohm/sq.

Preferably the resistive film constituting the surface acoustic wave absorber has a substantially linear tapered edge adjacent to the IDT pattern and extends to a back edge of the substrate.

The invention also extends to a SAW device comprising a substrate; two IDTs spaced apart for propagation of a surface acoustic wave therebetween on a surface of the substrate; and a resistive film constituting a surface acoustic wave absorber between each IDT and a respective edge of the substrate, the resistive film also underlying the IDTs. Preferably each surface acoustic wave absorber extends between the respective IDT and substrate edge through a distance of about 80 wavelengths of the surface acoustic wave to be propagated between the IDTs.

Figure 2:
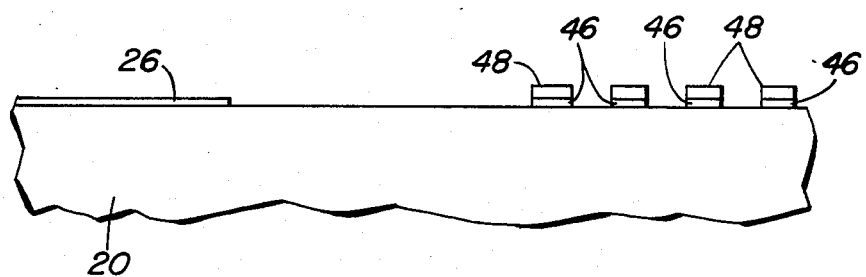
Figure 3:
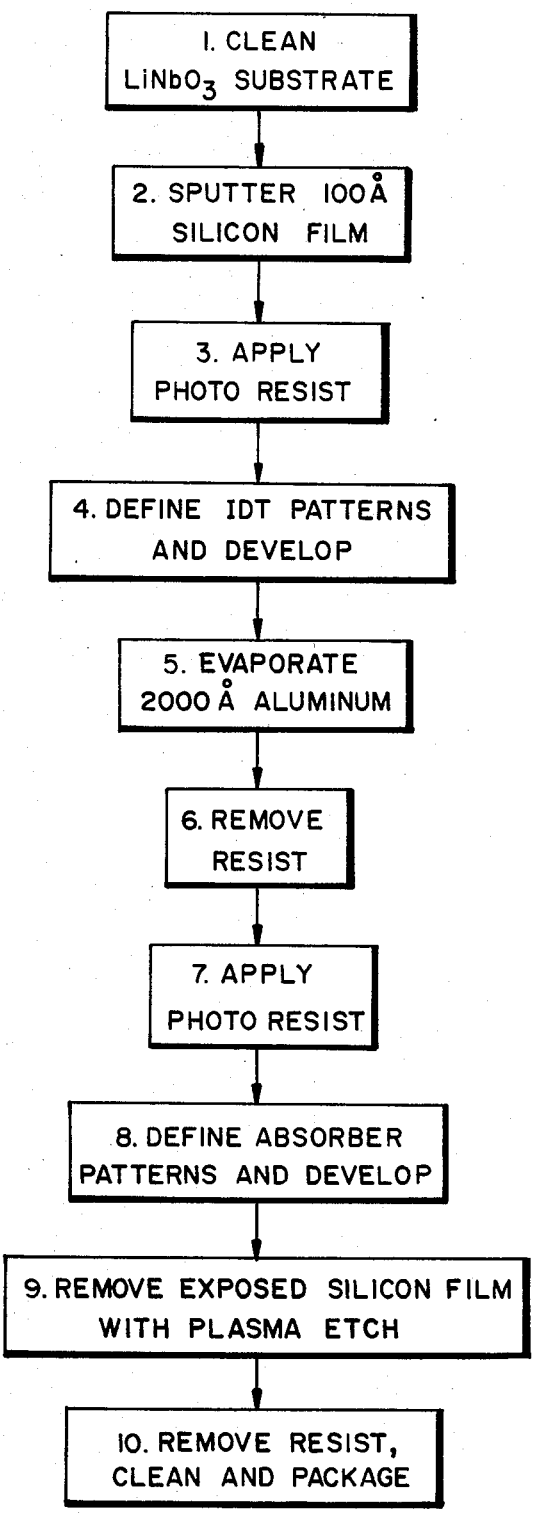

The invention will be further understood from the following description with reference to the accompanying drawings, in which:

FIG. 1 schematically illustrates a SAW device in accordance with an embodiment of the invention;

FIG. 2 is a schematic sectional illustration of the form of part of the SAW device of FIG. 1; and FIG. 3 is a flow chart showing steps in a method of producing a SAW device in accordance with the invention.

Referring to FIG. 1, there is illustrated a SAW device which comprises a lithium niobate (LiNbO$_3$) substrate 20 on which there are formed two IDTs 22, 24, and surface acoustic wave absorber regions 26, 28. The IDTs 22, 24 serve for transducing a surface acoustic wave which is propagated therebetween, and to this end each IDT comprise conductive rails 30 between which are arranged inter-digital fingers of which for the sake of clarity only the outline is shown. By way of example, it is observed that the IDT 22 may be an apodized IDT having an apodization pattern as illustrated in FIG. 1 in an active region 32 thereof, and the IDT 24 may be a non-apodized IDT having an active region 34, the IDTs serving respectively as the input and output transducers of a bandpass filter.

In addition to its active region 32 or 34, each IDT 22 or 24 includes a reflection-suppressing region 36 or 38 respectively adjacent the back edge of the active region. In each reflection-suppressing region fingers connected to the rails 30 are of successively decreasing length to define a linearly tapering back edge of each IDT. The fingers in these regions are spaced apart with a pitch of lambda/4, where lambda is the wavelength of the surface acoustic wave to be propagated, so that they suppress reflections at the back edges of the IDTs. The reflection-suppression region 36 of the IDT 22 is split into two halves (a) and (b) which taper from a central gap in the last fingers of the active region 32 of this IDT. A more detailed description of the reflection-suppressing regions and the manner in which they act to suppress reflections is contained in the copending patent application entitled "SAW devices with reflection-suppressing fingers" already referred to, the claims of which are directed to this subject matter and to which reference is directed in this respect.

As is well known, the IDTs 22 and 24 are bidirectional devices which transduce not only surface acoustic waves propagating in the desired direction to or from the other IDT, but also waves propagating to or from the edges 40 and 42 of the substrate 20. The surface acoustic wave absorber regions 26 and 28 serve to attenuate such undesired waves to such an extent that waves reflected at these edges 40 and 42 have a negligible effect upon the IDTs and do not degrade the performance of the SAW device. For example, as described below each surface acoustic wave absorber region may provide an attenuation of 0.5 dB/wavelength and may be at least 80 lambda long in the direction of propagation of surface acoustic waves, to provide a total attenuation of at least 80 dB for waves reflected at the edges 40 and 42.

In order to suppress any possible wave reflection at the front edge of each surface acoustic wave absorber region 26 or 28, as illustrated in FIG. 1 this is linearly tapered to complement the shape of the back edge of the adjacent reflection-suppressing region 36 or 38. This taper may be smooth and continuous as indicated in FIG. 1, or it may be linearly stepped with steps each having a width of lambda/4 in order to complement precisely the shape of the adjacent reflection-suppressing region, as is shown in detail in FIG. 2 of the copending patent application already referred to. As described therein, reflections from adjacent such steps are out of phase with one another due to the lambda/4 pitch of the steps, whereby they cancel one another. The same effect occurs with a linearly smooth and continuous taper, whereby in either case there is negligible reflection at the boundary of the acoustic absorber region 26 or 28.

The above comments apply across the width of the aperture A of the IDTs; outside of this aperture there is substantially no surface acoustic wave so that there is little need for either reflection-suppressing fingers or a tapered surface acoustic wave boundary. As shown in FIG. 1, the surface acoustic wave absorber regions have perpendicular boundaries 44 outside the aperture A.

In constrast to known SAW devices using materials such as viscous epoxy as surface acoustic wave absorbers, in accordance with this embodiment of the invention the surface acoustic wave absorber regions 26 and 28 are electro-acoustic absorber regions which are constituted by a thin resistive film on the substrate surface. In this embodiment of the invention this is a thin film of amorphous doped silicon having a thickness of about 100 Angstrom units (10 nm) and a sheet resistivity of at least about 0.5 Mohm/sq. Such a film provides the attenuation of about 0.5 dB/wavelength mentioned above. In this respect the electro-acoustic absorber is an absorber which absorbs the surface acoustic wave by coupling the electric fields associated with the wave to carriers in the resistive film constituting the absorber.

The silicon film is provided not only to constitute the electro-acoustic absorber regions 26 and 28; it also underlies the conductive rails and fingers of the IDTs 22 and 24, thereby enhancing the adhesion of these to the substrate. This is shown in detail in the sectional illustration in FIG. 2.

As shown in FIG. 2, the substrate 20 has formed thereon the thin silicon film as described above, which forms not only an electro-acoustic absorber region, e.g. 26, but also an adhesion-enhancing film 46 under each of the fingers 48 of the adjacent IDT. The film 46 similarly extends under the conductive rails 30. As the fingers 48 and rails 30 are themselves conductive, they electrically short the resistive film underlying them so that this has no disadvantageous effect in the regions of the IDTs.

FIG. 3 shows a flow chart of a sequence of ten steps numbered 1 to 10 used for producing SAW devices as described above with reference to FIGS. 1 and 2. Initially (step 1), the lithium niobate substrate is cleaned in known manner. The amorphous doped silicon film is then (step 2) sputtered onto the surface of the substrate to the desired thickness of about 100 Angstrom units. This thickness determines the sheet resistivity and the absorption effect of the absorbing regions 26 and 28, it having been determined experimentally that thicknesses of this order provide sheet resistivities of at least about 0.5 Mohm/sq and correspond to a maximum point in a graph of absorption against thickness or sheet resistivity at about 0.5 dB/wavelength.

In step 3, photoresist is applied over the silicon film, and in step 4 the desired pattern of the IDTs' fingers and conductive rails is defined through a printing mask and the photoresist is developed in known manner. In step 6 the IDTs are formed in this desired pattern by evaporating aluminum, onto the silicon film in the areas where this is exposed by the developed photoresist, to a desired thickness of typically 2000 Angstrom units (200 nm). As already indicated, the aluminum adheres more readily to the silicon film than it does directly to a lithium niobate substrate, whereby this step is more readily achieved with improved adhesion of the IDTs.

In step 6 the remaining photoresist and unwanted aluminum is removed in conventional manner, and in step 7 a new layer of photoresist is applied over the silicon film and aluminum IDT patterns. The desired patterns of the silicon film electro-acoustic absorber regions at the ends of the SAW device substrate are then defined in step 8 using a printing mask, and the photoresist is developed.

In step 9, the silicon film is removed from all of the areas where it is exposed using a carbon tetrafluoride and oxygen plasma etch. The silicon film remains in those regions where it is protected by the photoresist (i.e. in the electro-acoustic absorber regions) and in those regions where it is overlaid by the aluminum IDTs. In the final step 10, the remaining photoresist is removed and conventional cleaning and packaging processes are performed. Where many SAW devices are simultaneously manufactured on a single wafer, this step 10 also includes the process of dividing the wafer into the individual SAW devices in known manner.

The manufacture of SAW devices in the prior art involves a further disadvantage in that the lithium niobate substrate is strongly piezo-electric and consequently frequently creates surface charges which electrostatically clamp it to the photo mask plate when the IDT patterns are being defined. In the method described above the silicon film provides the further advantage that it effectively shorts such charges, thereby removing this disadvantage in using photo mask plates in steps 4 and 8.

Although a particular embodiment of the invention has been described in detail above, it should be appreciated that the invention is not limited to this, but is applicable to numerous variations of this. For example, the resistive film may be of different materials and thicknesses; in particular it may be of germanium or tellurium, or it may be in the form of a metal film grid providing the desired sheet resistivity. Similarly the substrate may be of a suitable material other than lithium niobate, and the IDTs may be a suitable material other than aluminum, for example gold.

In addition, the electro-acoustic absorber regions and IDTs may have different shapes and configurations either with or without reflection-suppressing features. In particular, it is observed that the front edges of the electro-acoustic absorber regions need not be continuously substantially linearly tapered across the entire width of the IDT aperture, but instead may have a sawtooth or serrated form with the same reflection-suppressing result. Furthermore, other sequences of steps may be used in forming the SAW devices.

These and many other modifications, variations and adaptations may be made without departing from the scope of the invention as defined in the claims.

What is claimed is:

1. A method of producing a SAW (surface acoustic wave) device comprising the steps of:
   forming a resistively conductive film on a surface of a substrate of piezo-electric material; and
   forming at least one IDT (inter-digital transducer) for the SAW device on the resistively conductive film.

2. A method as claimed in claim 1 wherein the resistively conductive film is formed on substantially all of said surface, the method further including the step of removing part of the film after forming the IDT.

3. A method as claimed in claim 2 wherein the step of removing part of the film comprises the step of leaving the film in at least one area on the substrate surface to define a surface acoustic wave absorber region in this area.

4. A method as claimed in claim 3 wherein the film is left in at least one area defining a surface acoustic wave absorber region adjacent to an IDT formed on the film.

5. A method as claimed in claim 4 wherein the film is left, in each area defining a surface acoustic wave absorber region region adjacent to an IDT, with a substantially linear tapered edge adjacent to the IDT.

6. A method as claimed in claim 2 wherein the resistively conductive film comprises a silicon film having a sheet resistivity of at least about 0.5 Mohm/sq.

7. A method as claimed in claim 6 wherein the silicon film is formed on the substrate surface by sputtering.

8. A method as claimed in claim 6 wherein the step of removing part of the silicon film after forming the IDT comprises etching the silicon film.

9. A method as claimed in claim 8 wherein the step of forming the IDT comprises evaporating aluminum onto the silicon film in the pattern of the IDT.

10. A method as claimed in claim 1 wherein the resistively conductive film comprises a silicon film.

11. A method as claimed in claim 10 wherein the silicon film is formed with a thickness to provide a sheet resistivity of at least about 0.5 Mohm/sq.

12. A method as claimed in claim 11 wherein the substrate material is lithium niobate.

13. A method as claimed in claim 1 wherein the resistively conductive film is formed on the substrate surface in the pattern of each IDT to be formed thereon.

14. A method as claimed in claim 1 wherein the resistively conductive film is formed on the substrate surface in the pattern of each IDT to be formed thereon and with at least one area defining a surface acoustic wave absorber region adjacent to this pattern, the resistively conductive film constituting a surface acoustic wave absorber in this region.

15. A method as claimed in claim 14 wherein the film is formed with a substantially linear tapered edge of each area defining a surface acoustic wave absorber region adjacent to an IDT pattern.

16. A method as claimed in claim 14 wherein the film comprises a silicon film having a sheet resistivity of at least about 0.5 Mohm/sq.

17. A SAW (surface acoustic wave) device comprising at least one IDT (inter-digital transducer) on a resistively conductive film, having substantially the same pattern as the IDT, on a surface of a substrate of piezoelectric material.

18. A SAW device as claimed in claim 17 and including on the substrate surface a resistively conductive film constituting a surface acoustic wave absorber in a region adjacent to the IDT.

19. A SAW device as claimed in claim 18 wherein the resistively conductive film constituting the surface acoustic wave absorber and the resistively conductive film having the IDT thereon are films of substantially the same material and thickness.

20. A SAW device as claimed in claim 19 wherein each of said films comprises an amorphous silicon film.

21. A SAW device as claimed in claim 20 wherein each of said films has a sheet resistivity of at least about 0.5 Mohm/sq.

22. A SAW device as claimed in claim 21 wherein the substrate material is lithium niobate.

23. A SAW device as claimed in claim 18 wherein the resistively conductive film constituting the surface acoustic wave absorber has a substantially linear tapered edge adjacent to the IDT pattern.

24. A SAW device as claimed in claim 23 wherein the resistively conductive film constituting the surface acoustic wave absorber extends from adjacent to the IDT pattern to an edge of the substrate.

25. A SAW device as claimed in claim 18 wherein the resistively conductive film constituting the surface acoustic wave absorber extends from adjacent to the IDT pattern to an edge of the substrate.

26. A SAW device comprising a substrate; two IDTs spaced apart for propagation of a surface acoustic wave therebetween on a surface of the substrate; and a resistively conductive film constituting a surface acoustic wave absorber between each IDT and a respective edge of the substrate, the resistively conductive film also underlying the IDTs.

27. A SAW device as claimed in claim 26 wherein the resistively conductive film comprises an amorphous silicon film having a sheet resistivity of at least about 0.5 Mohm/sq.

28. A SAW device as claimed in claim 26 wherein each surface acoustic wave absorber extends between the respective IDT and substrate edge through a distance of about 80 wavelengths of the surface acoustic wave to be propagated between the IDTs.

* * * * *